United States Patent
Sato et al.

(10) Patent No.: US 8,119,510 B2
(45) Date of Patent: Feb. 21, 2012

(54) MANUFACTURING METHOD OF SEMICONDUCTOR DEVICE

(75) Inventors: Hiroshi Sato, Yamanashi (JP); Kenji Matsumoto, Yamanashi (JP); Hitoshi Itoh, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/706,237

(22) Filed: Feb. 16, 2010

(65) Prior Publication Data

US 2010/0210097 A1 Aug. 19, 2010

(30) Foreign Application Priority Data

Feb. 19, 2009 (JP) ................... 2009-037062

(51) Int. Cl.
*H01L 21/28* (2006.01)
*H01L 21/285* (2006.01)
*H01L 21/3205* (2006.01)

(52) U.S. Cl. ................. 438/591; 438/778; 257/E21.192

(58) Field of Classification Search .................. 438/591, 438/778; 257/E21.192
See application file for complete search history.

(56) References Cited

U.S. PATENT DOCUMENTS

| | | | |
|---|---|---|---|
| 5,897,358 A * | 4/1999 | Gardner et al. | 438/300 |
| 6,214,690 B1 * | 4/2001 | Gardner et al. | 438/400 |
| 7,719,626 B2 * | 5/2010 | Takahashi et al. | 349/46 |
| 2002/0089023 A1 * | 7/2002 | Yu et al. | 257/411 |
| 2005/0051856 A1 * | 3/2005 | Ono et al. | 257/411 |
| 2008/0284935 A1 * | 11/2008 | Takahashi et al. | 349/46 |
| 2009/0045399 A1 * | 2/2009 | Kaji et al. | 257/43 |
| 2009/0302370 A1 * | 12/2009 | Guha et al. | 257/324 |
| 2010/0044804 A1 * | 2/2010 | Chen et al. | 257/410 |
| 2010/0052072 A1 * | 3/2010 | Li et al. | 257/380 |
| 2010/0210097 A1 * | 8/2010 | Sato et al. | 438/585 |
| 2011/0031562 A1 * | 2/2011 | Lin et al. | 257/410 |

FOREIGN PATENT DOCUMENTS

| | | | |
|---|---|---|---|
| JP | 2002-170825 A | | 6/2002 |
| JP | 2005-079223 A | | 3/2005 |
| JP | 2010-192766 | * | 9/2010 |

* cited by examiner

*Primary Examiner* — Mary Wilczewski
(74) *Attorney, Agent, or Firm* — Pearne & Gordon LLP

(57) ABSTRACT

Provided is a manufacturing method of a semiconductor device including a gate insulating film which can be formed into a thin film and of which film composition is easy to be controlled. The manufacturing method includes: forming a manganese oxide film for serving as a gate insulating film on a semiconductor substrate, on which a transistor is formed; forming a conductive film for serving as a gate electrode on the manganese oxide film; and forming a gate electrode and a gate insulating film by processing the conductive film and the manganese oxide film.

7 Claims, 18 Drawing Sheets

MANUFACTURING METHOD OF SEMICONDUCTOR DEVICE

FIELD OF THE INVENTION

The present disclosure relates to a manufacturing method of a semiconductor device, particularly, to a forming method of a gate insulating film of a transistor.

BACKGROUND OF THE INVENTION

In a process of fabricating a transistor, a silicon substrate is cleaned with a dilute hydrofluoric acid, a silicon oxide film serving as a gate insulating film is formed, and a polysilicon electrode is formed thereon, and then a source/drain electrode is formed by means of patterning, etching, ion implanting, sidewall forming, and ion implanting. In order to guarantee high performance of the transistor according to miniaturization of the semiconductor device, it is inevitable that technologies relating to a structure of a transistor, formation of a gate insulating film, selection of a material of the insulating film, and a metal gate should be developed.

Recently, SiON and hafnium (Hf)-based HfSiON have been influential as a material of the gate insulating film (see, for example, Patent Documents 1 and 2).

Patent Document 1: Japanese Patent Laid-open Publication No. 2002-170825

Patent Document 2: Japanese Patent Laid-open Publication No. 2005-79223

BRIEF SUMMARY OF THE INVENTION

However, as disclosed in, for example, Patent Documents 1 and 2, in case of forming a gate insulating film with a plurality of elements, there may occur a problem in controlling film composition or forming a thin film.

In view of the foregoing, the present disclosure provides a manufacturing method of a semiconductor device including a gate insulating film which can be formed into a thin film and of which film composition is easy to be controlled.

In order to solve the above-mentioned problem, in accordance with one aspect of the present invention, there is provided a manufacturing method of semiconductor device, the method including: forming a manganese oxide film for serving as a gate insulating film on a semiconductor substrate, on which a transistor is formed; forming a conductive film for serving as a gate electrode on the manganese oxide film; and forming a gate electrode and a gate insulating film by processing the conductive film and the manganese oxide film.

Further, in accordance with another aspect of the present invention, there is provided a manufacturing method of a semiconductor device, the method including: forming a thermal oxide film having a controlled amount of oxide on a semiconductor substrate, on which a transistor is formed; forming a manganese oxide film for serving as a gate insulating film on the thermal oxide film having the controlled amount of oxide; forming a conductive film for serving as a gate electrode on the manganese oxide film; and forming a gate electrode and a gate insulating film by processing the conductive film and the manganese oxide film.

In accordance with still another aspect of the present invention, there is provided a manufacturing method of a semiconductor device, the method including: adsorbing oxygen on a semiconductor substrate, on which a transistor is formed, by controlling an adsorption amount of oxygen; forming a manganese oxide film for serving as a gate insulating film on the semiconductor substrate having the controlled adsorption amount of oxygen; forming a conductive film for serving as a gate electrode on the manganese oxide film; and forming a gate electrode and a gate insulating film by processing the conductive film and the manganese oxide film.

In accordance with the present disclosure, it is possible to provide a manufacturing method of a semiconductor device including a gate insulating film which can be formed into a thin film and of which film composition is easy to be controlled.

BRIEF DESCRIPTION OF THE DRAWINGS

The disclosure may best be understood by reference to the following description taken in conjunction with the following figures.

DETAILED DESCRIPTION OF THE INVENTION

Figure 1A:
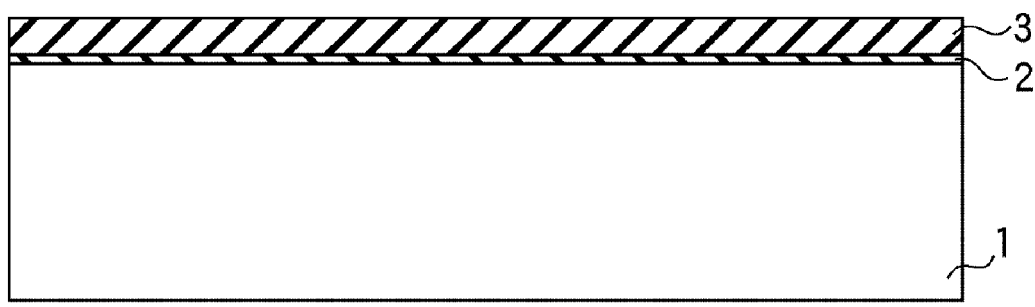
FIG. 1A is a cross-sectional view showing an example of a manufacturing method of a semiconductor device in accordance with a first embodiment.

Hereinafter, embodiments of the present invention will be described in detail with reference to the accompanying drawings. In the description, same reference numerals denote same parts through the whole drawings.

First Embodiment

Figure 1B:
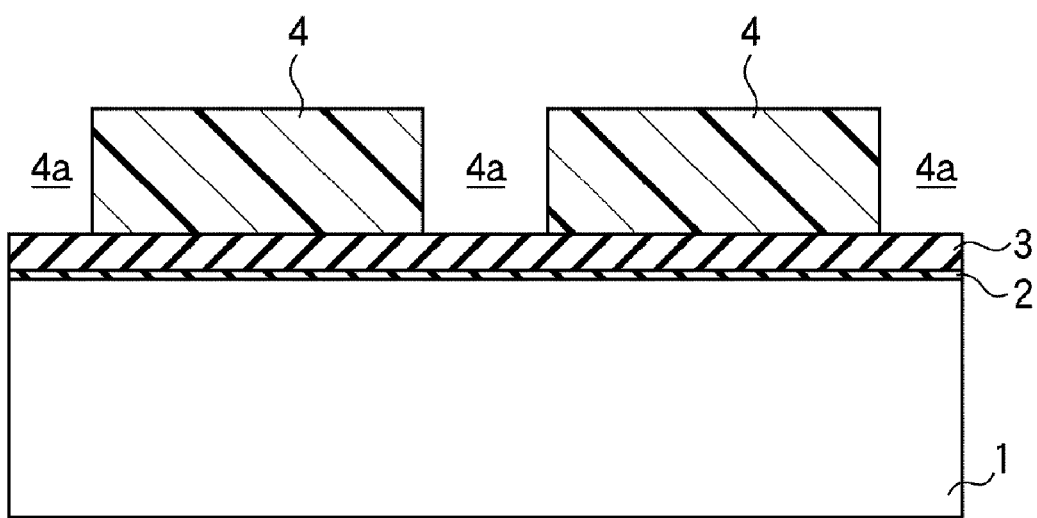
FIG. 1B is a cross-sectional view showing the example of the manufacturing method of the semiconductor device in accordance with the first embodiment.
Figure 1C:
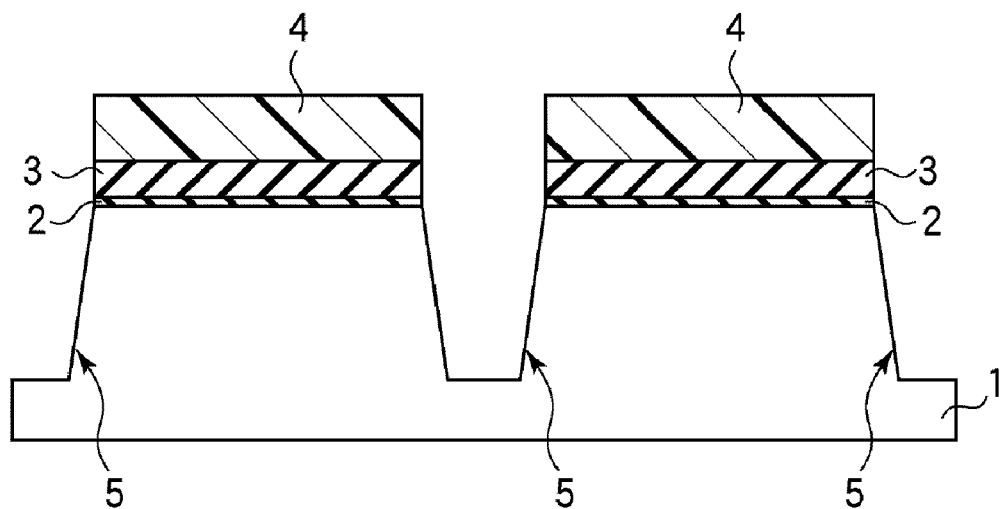
FIG. 1C is a cross-sectional view showing the example of the manufacturing method of the semiconductor device in accordance with the first embodiment.
Figure 1D:
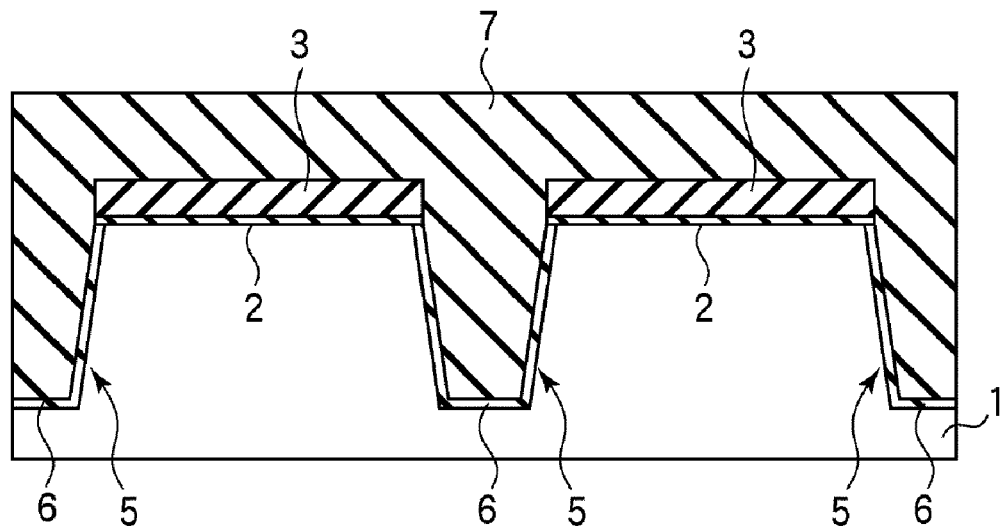
FIG. 1D is a cross-sectional view showing the example of the manufacturing method of the semiconductor device in accordance with the first embodiment.
Figure 1E:
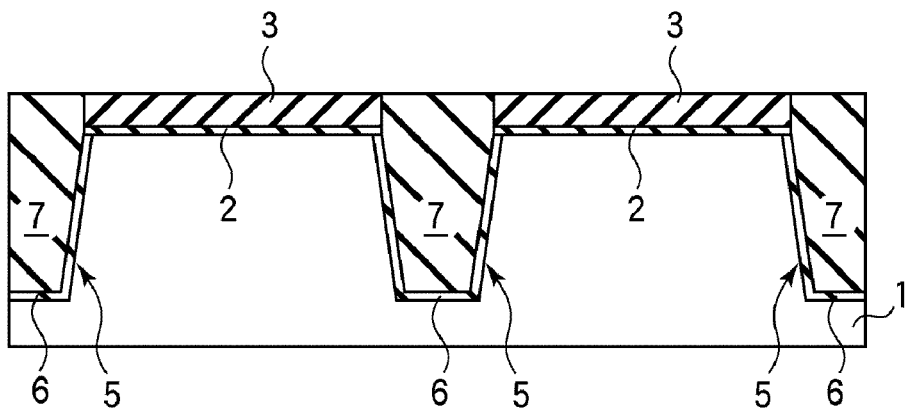
FIG. 1E is a cross-sectional view showing the example of the manufacturing method of the semiconductor device in accordance with the first embodiment.
Figure 1F:
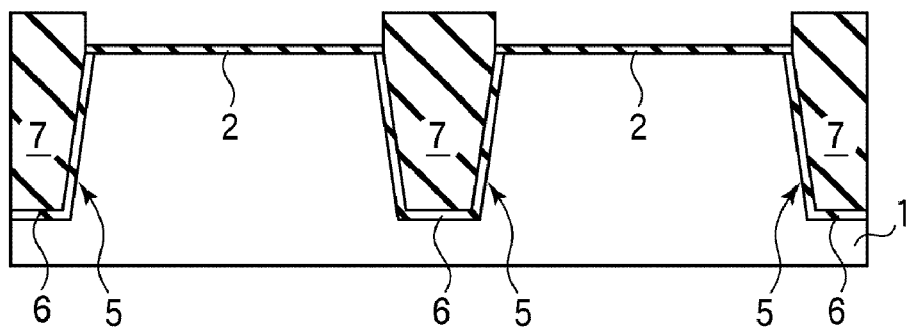
FIG. 1F is a cross-sectional view showing the example of the manufacturing method of the semiconductor device in accordance with the first embodiment.
Figure 1G:
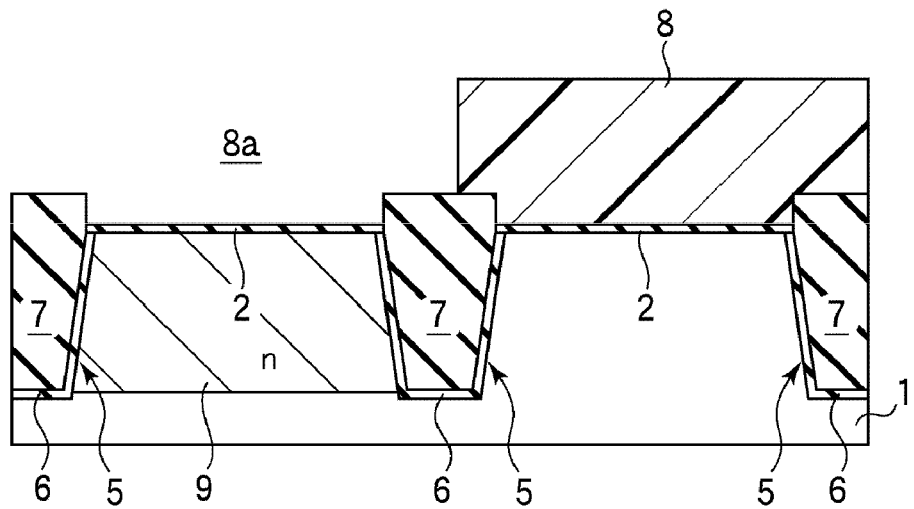
FIG. 1G is a cross-sectional view showing the example of the manufacturing method of the semiconductor device in accordance with the first embodiment.
Figure 1H:
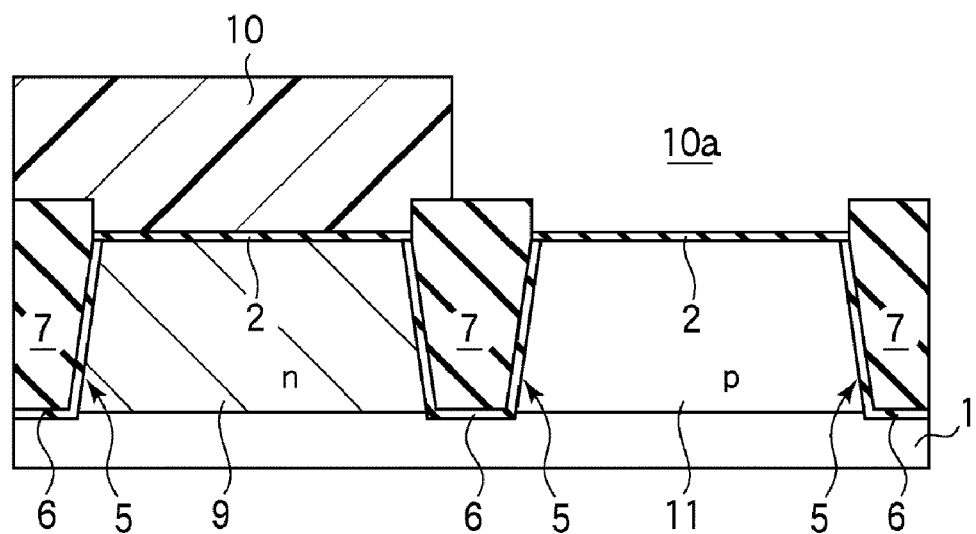
FIG. 1H is a cross-sectional view showing the example of the manufacturing method of the semiconductor device in accordance with the first embodiment.
Figure 1I:
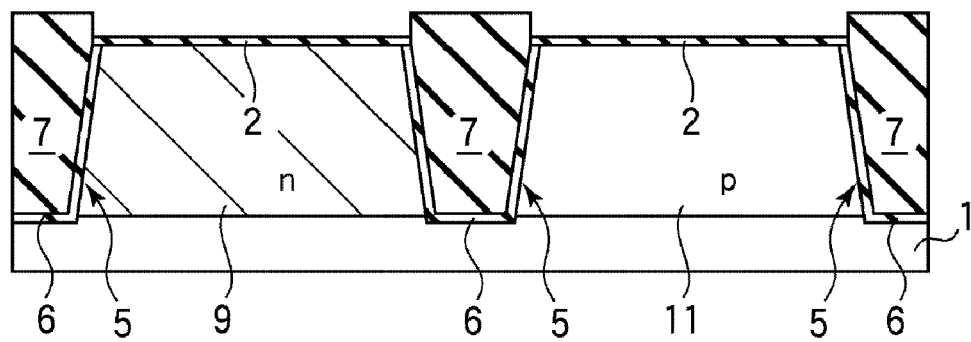
FIG. 1I is a cross-sectional view showing the example of the manufacturing method of the semiconductor device in accordance with the first embodiment.
Figure 1J:
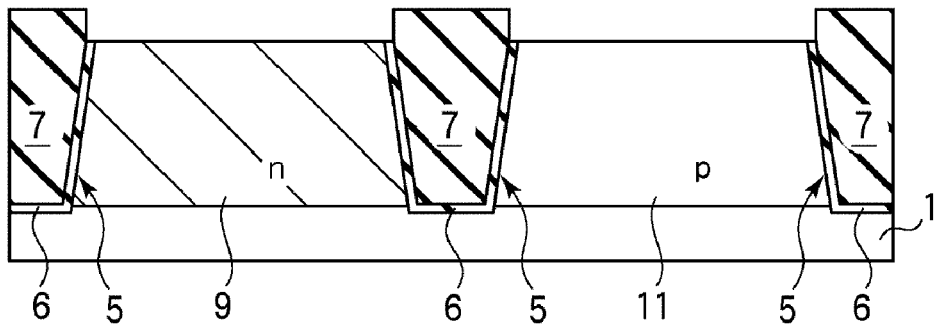
FIG. 1J is a cross-sectional view showing the example of the manufacturing method of the semiconductor device in accordance with the first embodiment.
Figure 1K:
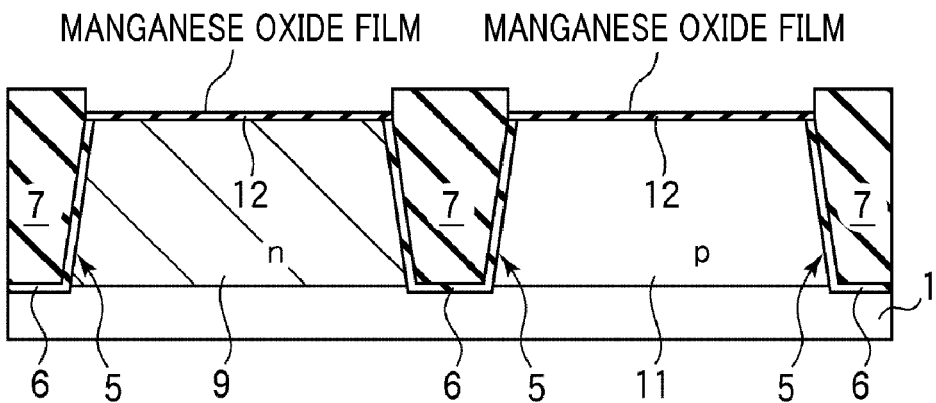
FIG. 1K is a cross-sectional view showing the example of the manufacturing method of the semiconductor device in accordance with the first embodiment.
Figure 1L:
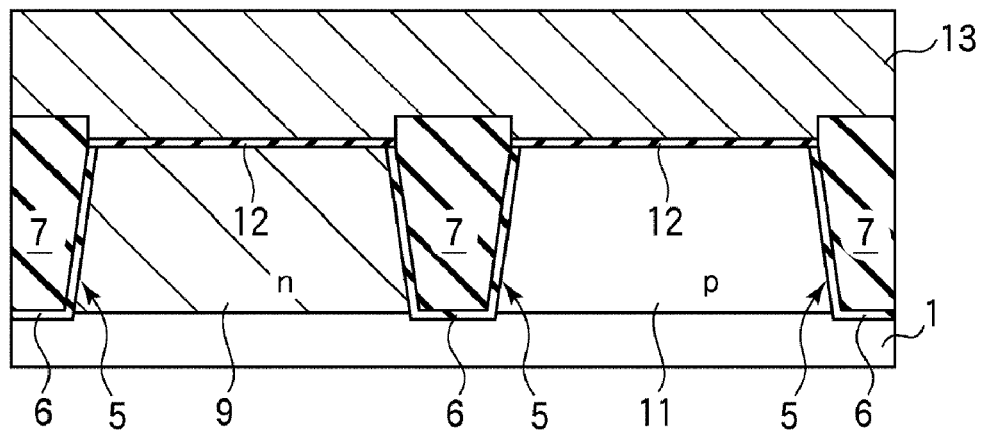
FIG. 1L is a cross-sectional view showing the example of the manufacturing method of the semiconductor device in accordance with the first embodiment.
Figure 1M:
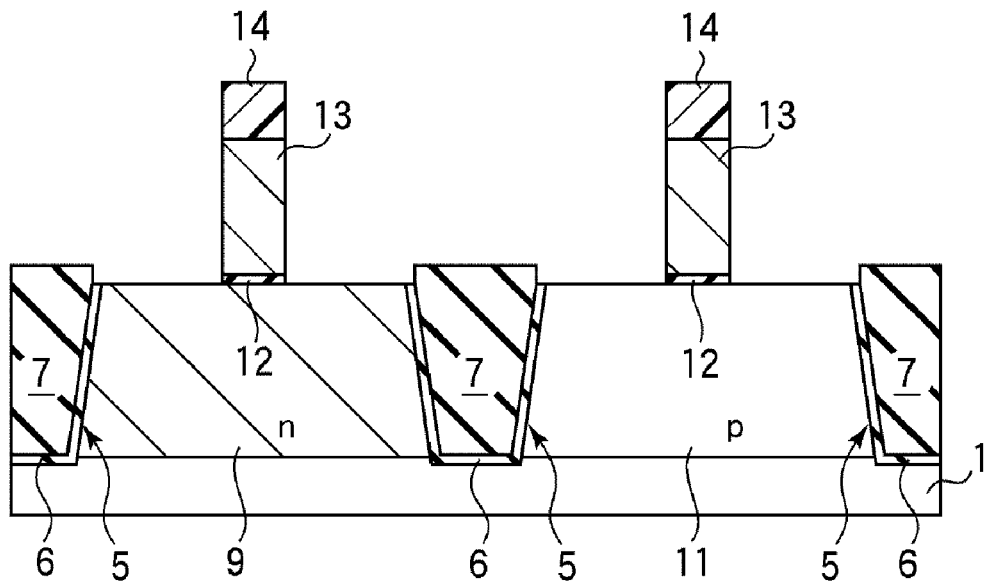
FIG. 1M is a cross-sectional view showing the example of the manufacturing method of the semiconductor device in accordance with the first embodiment.
Figure 1N:
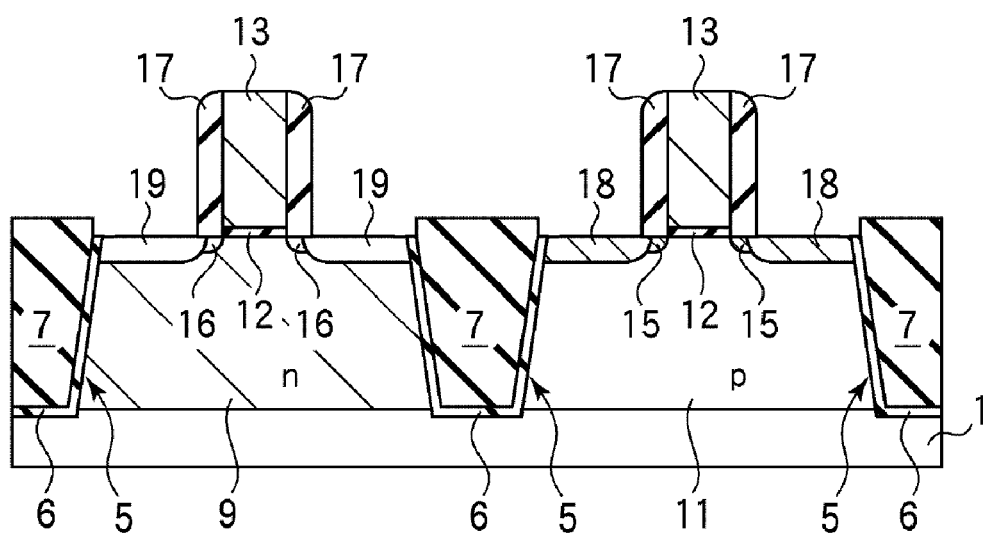
FIG. 1N is a cross-sectional view showing the example of the manufacturing method of the semiconductor device in accordance with the first embodiment.

FIGS. 1A to 1N are cross-sectional views showing an example of a manufacturing method of a semiconductor device in accordance with a first embodiment of the present invention.

(STI Forming Process)

First, a cleaning/drying apparatus cleans and dries a semiconductor substrate 1 (for example, a silicon wafer). Then, a thermal oxidation apparatus forms a thermal oxide film 2 on the substrate 1 by thermally oxidizing the cleaned and dried substrate 1. Subsequently, a CVD apparatus forms a silicon nitride film 3 on the thermal oxide film 2 (see FIG. 1A).

Thereafter, a spin coater coats the silicon nitride film 3 with a photoresist. Then, a baking apparatus pre-bakes the coated photoresist. Subsequently, an exposure apparatus exposes the pre-baked photoresist through a photomask on which a STI (Shallow Trench Isolation) pattern is formed. Subsequently, a spin developing apparatus develops the exposed photoresist. Thereafter, a photoresist pattern 4 including, e.g., a window 4a corresponding to the STI pattern is formed by post-baking the developed photoresist by the baking apparatus (see FIG. 1B).

Then, a dry etching apparatus etches the silicon nitride film 3 and the thermal oxide film 2 with, e.g., a CF-based etching gas, by using the photoresist pattern 4 as a mask. Subsequently, the dry etching apparatus etches the substrate 1 with, e.g., a chlorine-based etching gas by using the photoresist pattern 4 as a mask. By the dry etching, a shallow trench 5 is formed in the substrate 1 (see FIG. 1C).

Thereafter, a photoresist peeling apparatus peels off the photoresist pattern 4 from a surface of the silicon nitride film 3. Then, the cleaning apparatus cleans the substrate 1. Subsequently, the thermal oxidation apparatus thermally oxidizes the substrate 1. By the thermal oxidation, a thermal oxide film 6 is formed on a surface of the substrate 1 exposed to the thermal oxidation at an inner side of the shallow trench 5. Thereafter, the CVD apparatus forms a silicon oxide film 7 on the silicon nitride film 3 and a surface of the substrate 1 in which the shallow trench 5 is formed. The shallow trench 5 is filled with the silicon oxide film 7 (see FIG. 1D).

Then, a CMP apparatus polishes the silicon oxide film by using the silicon nitride film 3 as a stopper of polishing, and thus the silicon oxide film 7 remains in the inner side of the trench 5, thereby forming STI (see FIG. 1E).

Subsequently, a wet etching apparatus etches the silicon nitride film 3 with, e.g., hot phosphate. After wet etching, the thermal oxide film 2 underneath the silicon nitride film 3 remains (see FIG. 1F).

(Well Forming Process)

Thereafter, the spin coater coats the thermal oxide film 2 and the silicon oxide film 7 formed on the substrate 1's surface with a photoresist. Then, the baking apparatus pre-bakes the coated photoresist. Subsequently, the exposure apparatus exposes the pre-baked photoresist through a photomask on which an n-type well pattern is formed. Thereafter, the spin developing apparatus develops the exposed photoresist. Then, the baking apparatus post-bakes the developed photoresist, thereby, e.g., forming a photoresist pattern 8 having a window 8a, which corresponds to the n-type well pattern. Subsequently, an ion implanter implants n-type impurity ions, such as phosphorus ions, into the substrate 1, by using the photoresist pattern 8 as a mask, thereby forming an n-type well 9 within the substrate (see FIG. 1G).

Thereafter, the photoresist peeling apparatus peels off the photoresist pattern 8 from the thermal oxide film 2 and the silicon oxide film 7 formed on the substrate 1's surface. Then, the cleaning apparatus cleans the substrate 1. Subsequently, the spin coater coats the thermal oxide film 2 and the silicon oxide film 7 formed on the substrate's surface with a new photoresist. Thereafter, the baking apparatus pre-bakes the coated photoresist. Then, the exposure apparatus exposes the pre-baked photoresist through a photomask on which a p-type well pattern is formed. Subsequently, the spin developing apparatus develops the exposed photoresist. Thereafter, the baking apparatus post-bakes the developed photoresist, thereby, e.g., forming a photoresist pattern 10 having a window 8*a*, which corresponds to the p-type well pattern. Then, the ion implanter implants p-type impurity ions, such as boron ions, into the substrate 1, by using the photoresist pattern 10 as a mask, thereby forming an p-type well 11 within the substrate 1 (see FIG. 1H).

Subsequently, the photoresist peeling apparatus peels off the photoresist pattern 10 from the thermal oxide film 2 and the silicon oxide film 7 formed on the substrate 1' s surface. Thereafter, the cleaning apparatus cleans the substrate 1 (see FIG. 1I).

(Gate Insulating Film Forming Process)

Then, the wet etching apparatus etches the thermal oxide film 2 with, e.g., fluoric acid. After wet etching, the substrate 1' s surface (the n-type well 9 and the p-type well 11 in the present example) is exposed except a portion where the silicon oxide film (STI) 7 is formed. Subsequently, the cleaning apparatus cleans the substrate 1 (see FIG. 1J).

Thereafter, a manganese oxide CVD apparatus forms a manganese oxide film 12 on the exposed substrate 1' s surface. The manganese oxide film 12 serves as a gate insulating film. There will be described later the manganese oxide CVD apparatus and advantages of using the manganese oxide film 12 as a gate insulating film (see FIG. 1K).

(Gate Electrode Forming Process)

Then, the cleaning apparatus cleans the substrate 1. Subsequently, the CVD apparatus forms a polysilicon film 13 on the manganese oxide film 12 and the silicon oxide film 7 formed on the substrate 1' s surface (see FIG. 1L).

Thereafter, the spin coater coats the polysilicon film 13 with a photoresist. Then, the baking apparatus pre-bakes the coated photoresist. Subsequently, the exposure apparatus exposes the pre-baked photoresist through a photomask on which a gate electrode pattern is formed. Thereafter, the spin developing apparatus develops the exposed photoresist. Then, the baking apparatus post-bakes the developed photoresist, thereby forming a photoresist pattern 14 corresponding to the gate electrode pattern. Subsequently, the dry etching apparatus etches the polysilicon film 13 with, e.g., a chlorine-based etching gas, by using the photoresist pattern 14 as a mask. By the dry etching, the polysilicon film 13 is processed to have a gate electrode pattern (see FIG. 1M).

(Source/Drain Electrode Forming Process)

Thereafter, the photoresist peeling apparatus peels off the photoresist pattern 14 from the polysilicon film 13. Then, the cleaning apparatus cleans the substrate 1.

The source/drain electrode may be formed by a well-known method. Therefore, a forming method thereof will be briefly explained. In a general way, an n-type extension region 15 and a p-type extension region 16 are formed by implanting ions using the polysilicon film (gate electrode) 13, the silicon oxide film (STI) 7, and the photoresist (not illustrated) as masks. Then, a sidewall insulating film 17 is formed at a sidewall of the polysilicon film (gate electrode) 13. Subsequently, an n-type drain region 18 and a p-type drain region 19 are formed by implanting ions using the polysilicon film (gate electrode) 13 provided with the sidewall insulating film 17 formed at its sidewall, the silicon oxide film (STI) 7, and the photoresist (not illustrated) as masks (see FIG. 1N).

A transistor is formed by the above-described manufacturing method of the semiconductor device in accordance with the first embodiment.

Figure 2:
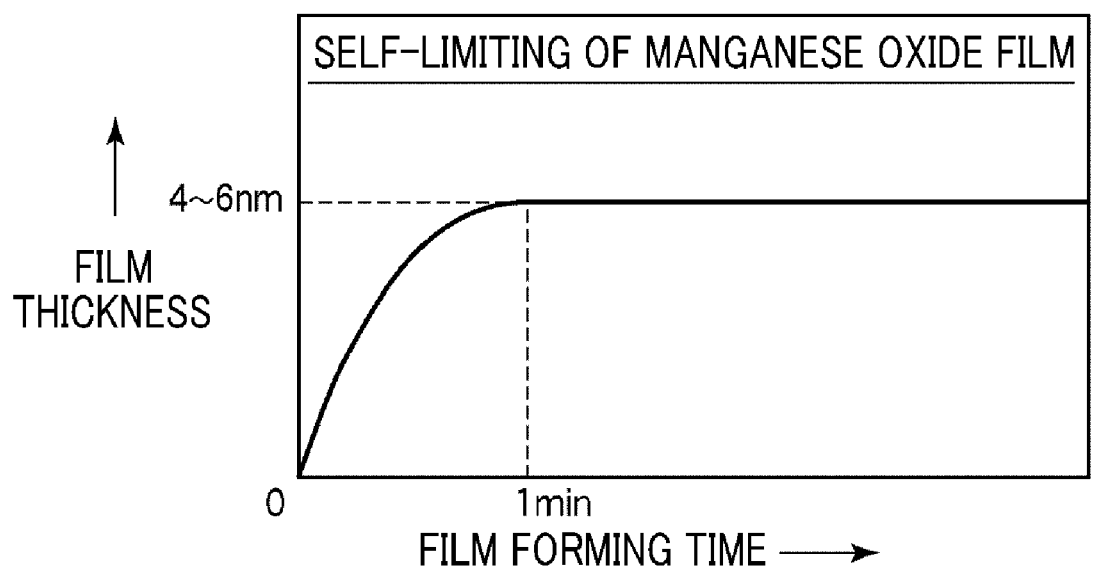
FIG. 2 shows a self-limiting property of manganese oxide.

In accordance with the manufacturing method of the semiconductor device of the first embodiment, the manganese oxide film 12 formed by the CVD method serves as a gate insulating film. The manganese oxide film 12 has a so-called "self-limiting" property as illustrated in FIG. 2, and, thus, it does not grow further than a predetermined film thickness regardless of a film forming time. The manganese oxide film 12 has a limit of film thickness ranging from about 4 to about 6 nm and reaches such a limit within about 1 minute of film forming time.

The manganese oxide film 12 has the limit of film thickness ranging from about 4 to about 6 nm. Accordingly, the manganese oxide film 12 formed by the CVD method is used as a gate insulating film, the gate insulating film can be formed as a thin film. Further, even if the film forming time exceeds about 1 minute, the film thickness of the manganese oxide film 12 does not increase further than the film thickness ranging from about 4 to about 6 nm regardless of the film forming time. Accordingly, it is easy to form the gate insulating film as a thin film without a need to accurately control the film forming time.

Further the manganese oxide film 12 has a non-crystalline form. Accordingly, it is possible to reduce a leakage current flowing from the gate electrode to the substrate.

Further, an interface between the manganese oxide film 12 and the substrate 1 and an interface between the manganese oxide film 12 and the gate electrode (the polysilicon film 13 in the present example) are smoother than an interface of SiON or hafnium (Hf)-based HfSiON. Accordingly, the manganese oxide film 12 has an advantage capable of suppressing electron trap or electron scattering of electric charge, as compared to SiON or HfSiON.

Furthermore, the manganese oxide film is composed of two elements of oxygen and manganese, and, thus, it is easy to control film composition thereof as compared to the gate insulating film composed of a plurality of, e.g., three or more elements such as SiON or HfSiON.

Accordingly, in accordance with the first embodiment, it is possible to provide a manufacturing method of a semiconductor device having a gate insulating film which can be formed into a thin film and of which film composition is easy to be controlled.

(Configuration of an Apparatus)

Hereinafter, there will be described an example of a manganese oxide film forming apparatus (manganese oxide CVD apparatus).

Figure 3:
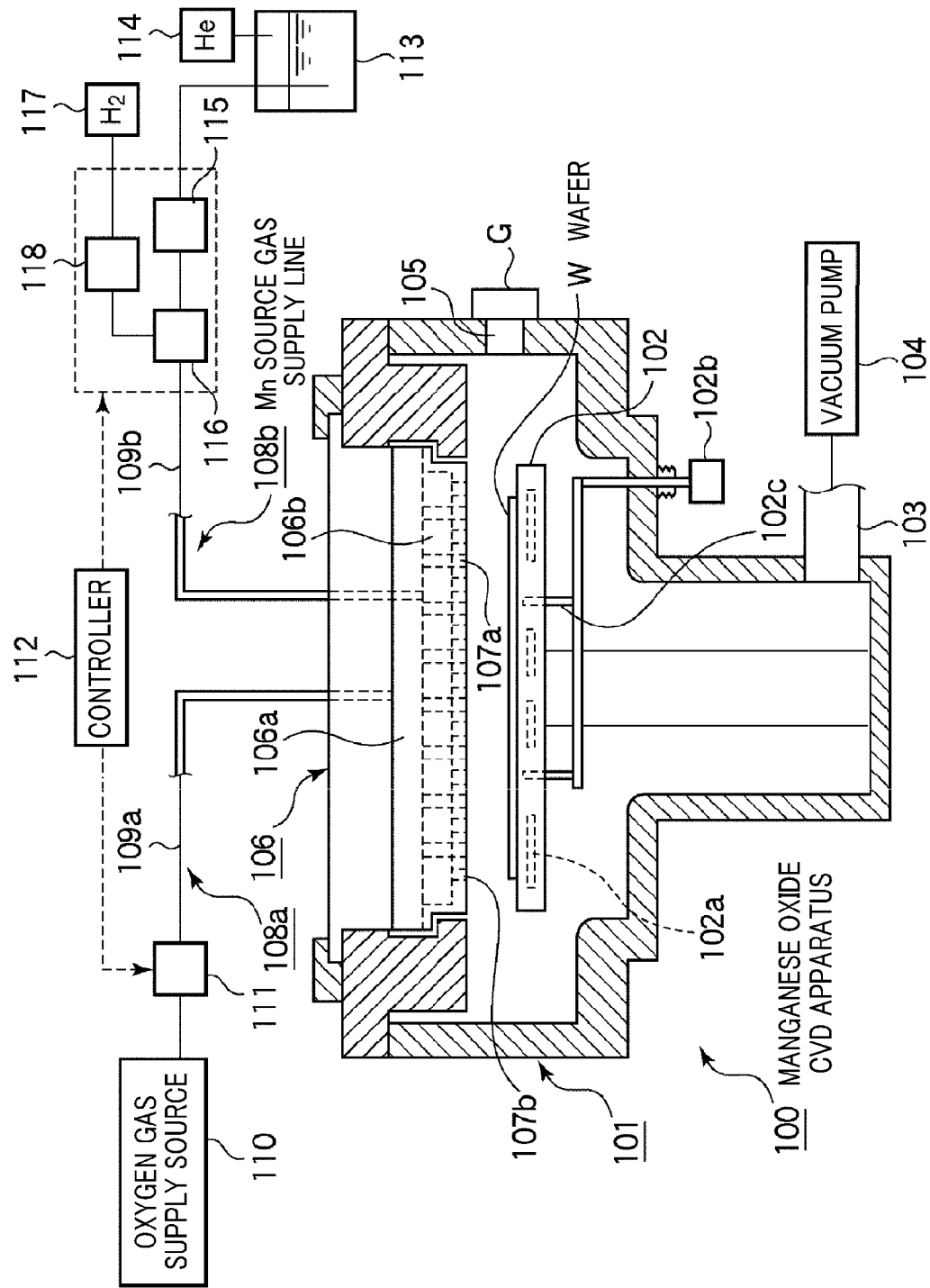
FIG. 3 is a cross-sectional view schematically showing an example of a manganese oxide film forming apparatus which can be used to perform the example of the manufacturing method of the semiconductor device in accordance with the first embodiment.

FIG. 3 is a cross-sectional view schematically showing an example of a manganese oxide film forming apparatus which can be used to perform the example of the manufacturing method of the semiconductor device in accordance with the first embodiment.

As shown in FIG. 3, the manganese oxide CVD apparatus 100 includes a processing chamber 101 serving as a vacuum chamber. Inside the processing chamber 101, a mounting table 102 for horizontally mounting thereon a wafer W is installed. Within the mounting table 102, a heater 102*a* for adjusting a temperature of the wafer is installed. Further, three elevating pins 102*c* (only two illustrated herein for the sake of convenience) capable of being elevated by an elevating mechanism 102*b* are installed. By these elevating pins 102*c*, the wafer W is transferred between the mounting table 102 and a non-illustrated wafer mechanism.

Furthermore, one end of an evacuation pipe 103 is connected to a lower portion of the processing chamber 101 and the other end of the evacuation pipe 103 is connected to a vacuum pump 104. At a side wall of the processing chamber 101, there is provided a transfer port 105 which can be opened and closed by a gate valve G.

At a ceiling portion of the processing chamber 101, there is installed a gas shower head 106 facing the mounting table 102. The gas shower head 106 includes gas chambers 106a and 106b partitioned separately from each other, and gases supplied into the gas chambers 106a and 106b are supplied into the processing chamber 101 through gas supply holes 107a and 107b, respectively.

The gas shower head 106 is connected to an oxygen gas supply line 108a that supplies a gas containing oxygen, e.g., an oxygen ($O_2$) gas, for forming manganese oxide into the gas chamber 106a. The oxygen gas supply line 108a includes an oxygen gas supply passage 109a and is connected to an oxygen gas supply source 110 at an upstream side of the oxygen gas supply passage 109a.

Further, a reference numeral 111 of FIG. 3 denotes a flow rate controller which controls supply and stoppage of the oxygen gas to be supplied into the gas chamber 106a by controlling a flow rate of the oxygen gas in response to a control signal from a controller 112 to be described later.

Furthermore, the gas shower head 106 is connected to a Mn source gas supply line 108b for introducing vapor of an organic compound containing manganese into the gas chamber 106b. The Mn source gas supply line 108b includes a source gas supply passage 109b and is connected to a source storage 113 at an upstream side of the source gas supply passage 109b.

The source storage 113 stores therein an organic compound containing manganese, such as $(EtCp)_2Mn$ (Bis(ethylcyclopentadienyl)manganese), in a liquid phase. Further, the source storage 113 is connected to a pressing unit 114, and a He gas or an Ar gas supplied from the pressing unit 114 pressurizes the inside of the source storage 113. With this configuration, $(EtCp)_2Mn$ can be flown toward the gas shower head 106.

There are installed a flow rate controller 115 including a liquid mass flow controller or a valve and a vaporizer 116 for vaporizing $(EtCp)_2Mn$ at the source gas supply passage 109b in this sequence from its upstream side. The vaporizer 116 brings $(EtCp)_2Mn$ into contact with a $H_2$ gas serving as a carrier gas supplied from a carrier gas supply source 117; mixes them; so as to vaporizes $(EtCp)_2Mn$; and supplies the vaporized $(EtCp)_2Mn$ to the gas chamber 106b.

A reference number 118 of FIG. 3 denotes a flow rate controller which controls supply and stoppage of the vapor of the organic compound containing manganese to be supplied into the gas chamber 106b by controlling a flow rate of the carrier gas in response to a control signal from the controller 112 to be described later.

The controller 112 includes a data processor composed of a program, a memory, and a CPU. The program includes commands (steps) for executing each step by allowing the controller 112 to send a control signal to respective parts of the manganese oxide CVD apparatus 100. Further, for example, the memory includes storage areas where process parameters such as a process pressure, a process temperature, a process time, a gas flow rate or a power value are written. When the CPU executes each command of the program, these parameters are read out and control signals corresponding to the parameters are sent to respective parts of the manganese oxide CVD apparatus 100. This program (including a program for inputting or displaying the process parameters) is stored in a storage 75A, i.e., a computer storage medium such as a flexible disc, a compact disc, a hard disc, and a magneto-optical disc (MO) and installed in the controller 112.

In accordance with the above-described manganese oxide CVD apparatus 100, the manganese oxide film 12 serving as a gate insulating film can be formed on the surface of the substrate 1 by a reaction between the vapor of the organic compound containing manganese such as $(EtCp)_2Mn$ vapor and a gas containing oxygen such as an oxygen ($O_2$) gas, for forming manganese oxide.

The manganese oxide CVD apparatus 100 uses $(EtCp)_2Mn$ [$=Mn(C_2H_5C_5H_4)_2$] as an organic compound containing manganese, but it may be possible to use one or more organic compound containing manganese selected from a group consisting of $Cp_2Mn[=Mn(C_5H_5)_2]$, $(MeCp)_2Mn[=Mn(CH_3C_5H_4)_2]$, $(i\text{-PrCp})_2Mn[=Mn(C_3H_7C_5H_4)_2]$, $MeCpMn(CO)_3[=(CH_3C_5H_4)Mn(CO)_3]$, $(t\text{-BuCp})_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)(EtCp)[=Mn(C_7H_{11}C_2H_5C_5H_4)]$, $Mn(acac)_2[=Mn(C_5H_7O_2)_2]$, $Mn(DPM)_2[=Mn(C_{11}H_9O_2)_2]$, $Mn(acac)_3[=Mn(C_5H_7O_2)_3]$, $Mn(hfac)_2[=Mn(C_5HF_6O_2)_3]$, $((CH_3)_5Cp)_2Mn[=Mn((CH_3)_5C_5H_4)_2]$, instead of $(EtCp)_2Mn$.

Further, the manganese oxide CVD apparatus 100 uses the oxygen ($O_2$) gas as a gas containing oxygen for forming manganese oxide, but it may be possible to use one or more gases selected from a group consisting of $H_2O$ (water vapor), $N_2O$, $NO_2$, $NO$, $O_3$, $H_2O_2$, $CO$, $CO_2$, and alcohol, instead of the oxygen ($O_2$) gas.

The alcohol may include ethyl alcohol and methyl alcohol.

Second Embodiment

In the first embodiment, a gate insulating film made of the manganese oxide film 12 is formed on the substrate 1's surface by reacting the vapor of the organic compound containing manganese with the gas containing oxygen. However, there is no limit on the oxygen supply source. It may be possible to form an insulating film made of the manganese oxide film 12 by using the vapor of the organic compound containing manganese and a native oxide film formed on the substrate 1 or degas (moisture) from the substrate 1. Hereinafter, such an example will be explained as a manufacturing method of a semiconductor device in accordance with a second embodiment of the present invention.

First Example

Use of a Native Oxide Film

FIGS. 4A to 4F are cross-sectional views of a first example of a manufacturing method of a semiconductor device in accordance with the second embodiment of the present invention.

Figure 4A:
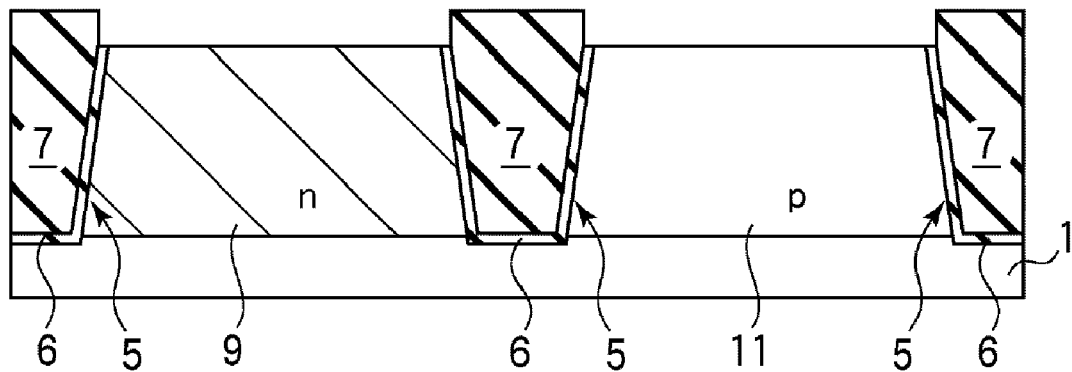
FIG. 4A is a cross-sectional view showing an example of a manufacturing method of a semiconductor device in accordance with a second embodiment.
Figure 4B:
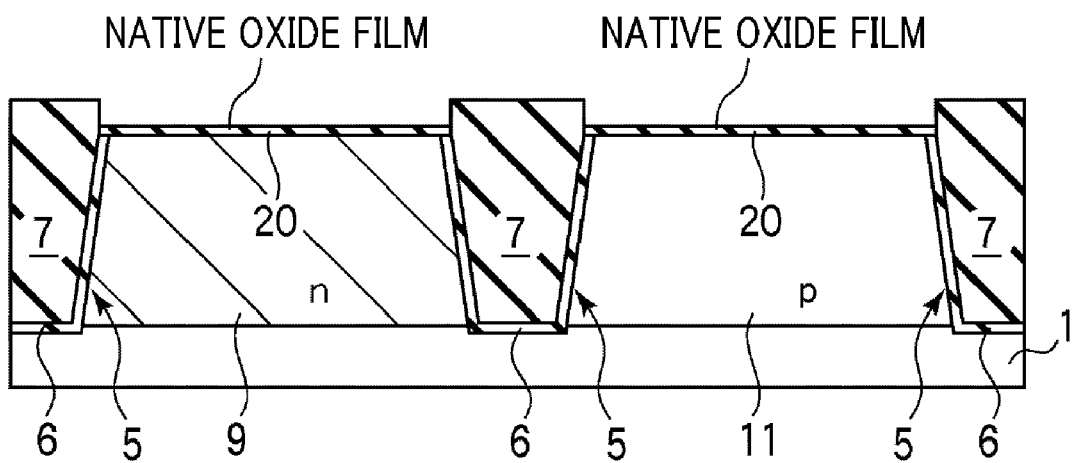
FIG. 4B is a cross-sectional view showing the example of the manufacturing method of the semiconductor device in accordance with the second embodiment.
Figure 4C:
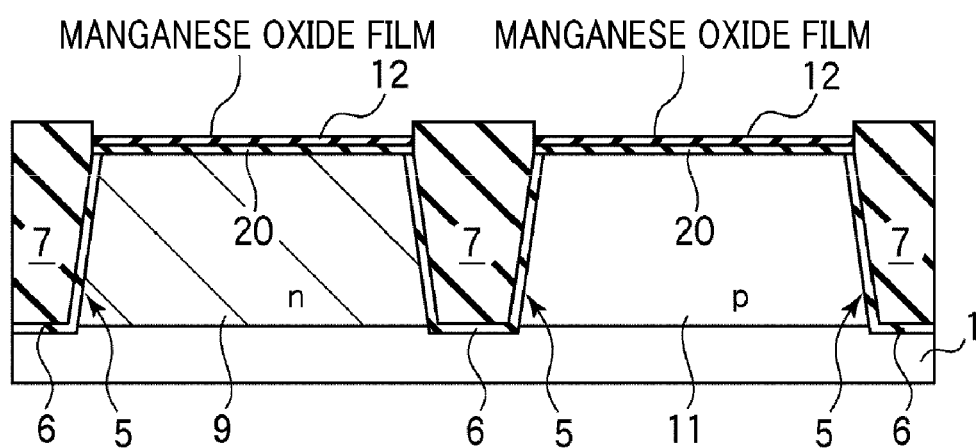
FIG. 4C is a cross-sectional view showing the example of the manufacturing method of the semiconductor device in accordance with the second embodiment.

In accordance with the manufacturing method explained with reference to FIGS. 1A to 1J, a structure shown in FIG. 4A is fabricated. In the structure of FIG. 4A, a thermal oxide film 2 has been etched with such as fluoric acid. After the thermal oxide film 2 is etched, the substrate 1 is cleaned in the first embodiment, but not in the present embodiment. Accordingly, a native oxide film 20 is formed on the substrate 1's surface (see FIG. 4B).

Figure 5:
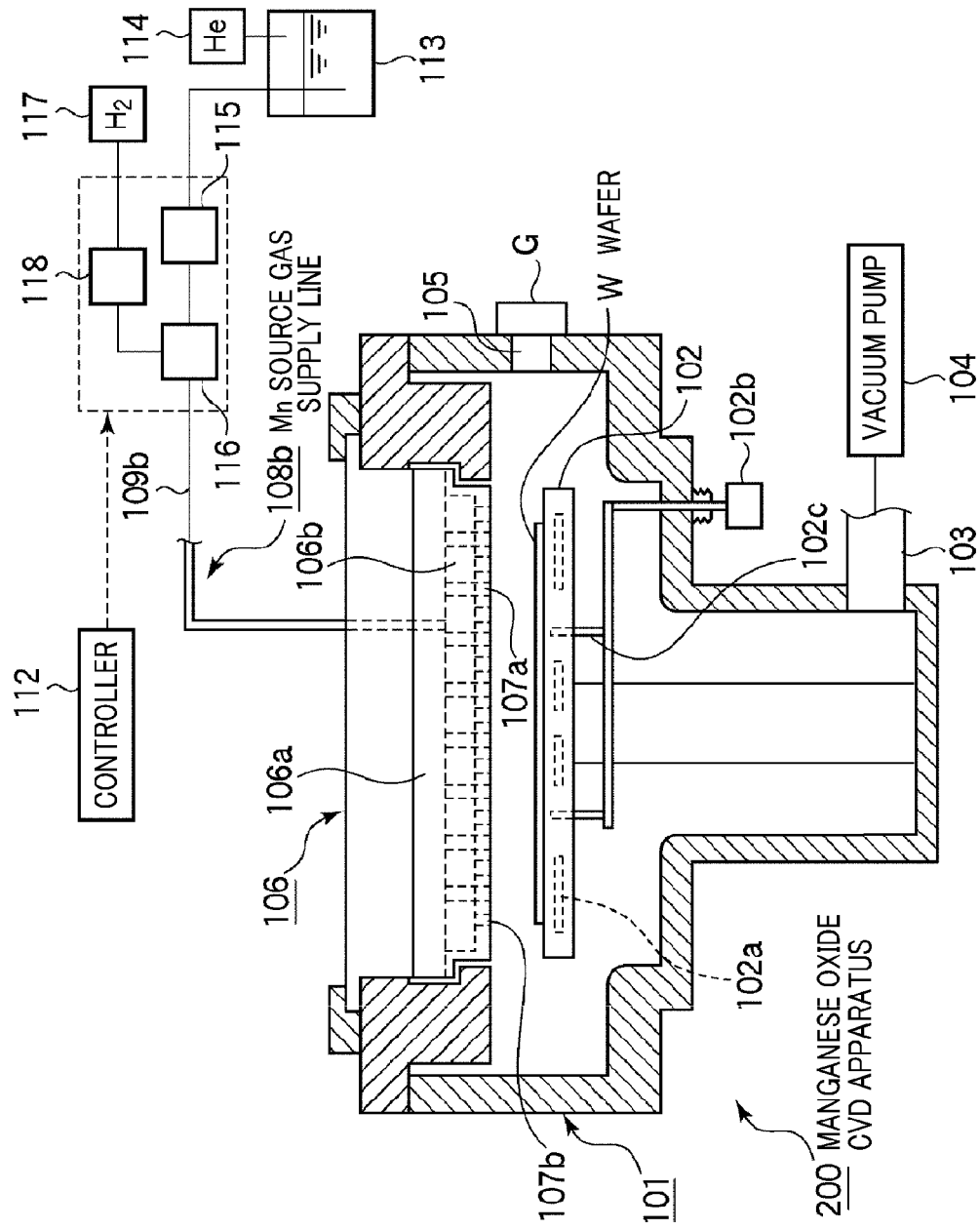
FIG. 5 is a cross-sectional view schematically showing an example of a manganese oxide film forming apparatus for performing the manufacturing method of the semiconductor device in accordance with the second embodiment.

Then, a manganese oxide CVD apparatus forms a manganese oxide film 12 on the native oxide film 20. When the manganese oxide film 12 is formed, vapor of an organic compound containing manganese is used but a gas containing oxygen is not used. An example of the manganese oxide CVD apparatus is illustrated in FIG. 5. The manganese oxide CVD apparatus 200 illustrated in FIG. 5 is different from the manganese oxide CVD apparatus 100 in that the former does not include the oxygen gas supply line 108a. The manganese oxide CVD apparatus 200 is identical with the manganese oxide CVD apparatus 100 except this oxygen gas supply line.

Therefore, same reference numerals denote same parts and thus descriptions thereof will be omitted.

In the present example, the native oxide film 20 serves as an oxygen supply source. By reacting oxygen contained in the native oxide film 20 with the vapor of the organic compound containing manganese, the manganese oxide film 12 is formed on the native oxide film 20 (see FIG. 4C).

Figure 4D:
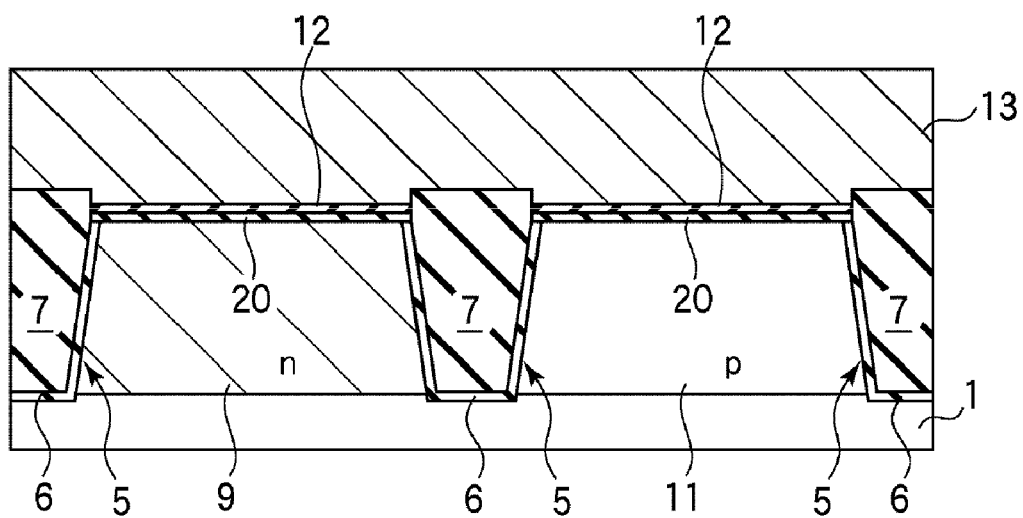
FIG. 4D is a cross-sectional view showing the example of the manufacturing method of the semiconductor device in accordance with the second embodiment.

Thereafter, in the same manner as the first embodiment, the substrate 1 is cleaned and then a polysilicon 13 is formed on the manganese oxide film 12 and a silicon oxide film 7 on the substrate 1' s surface (see FIG. 4D).

Figure 4E:
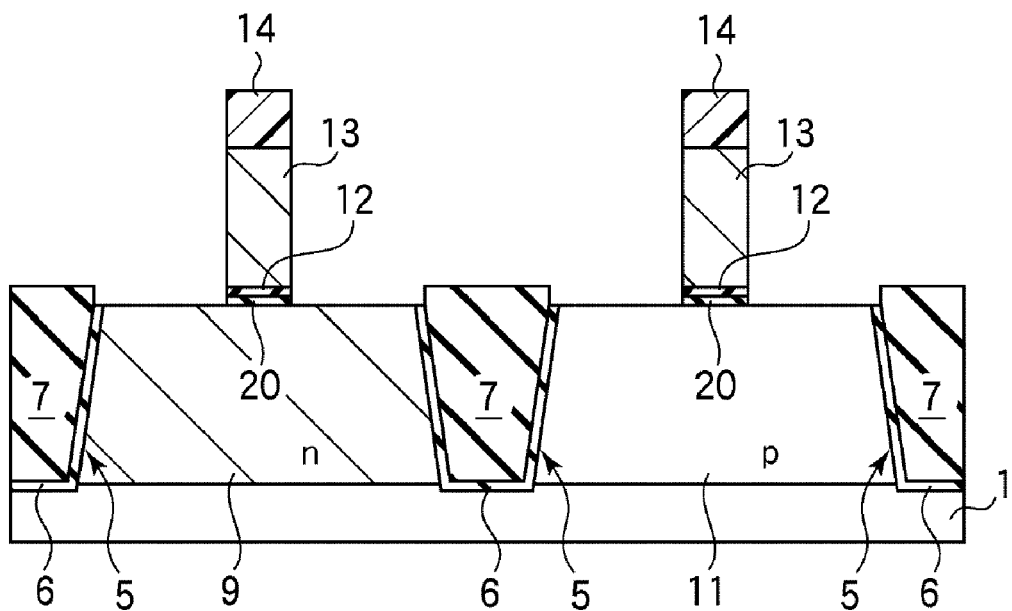
FIG. 4E is a cross-sectional view showing the example of the manufacturing method of the semiconductor device in accordance with the second embodiment.
Figure 4F:
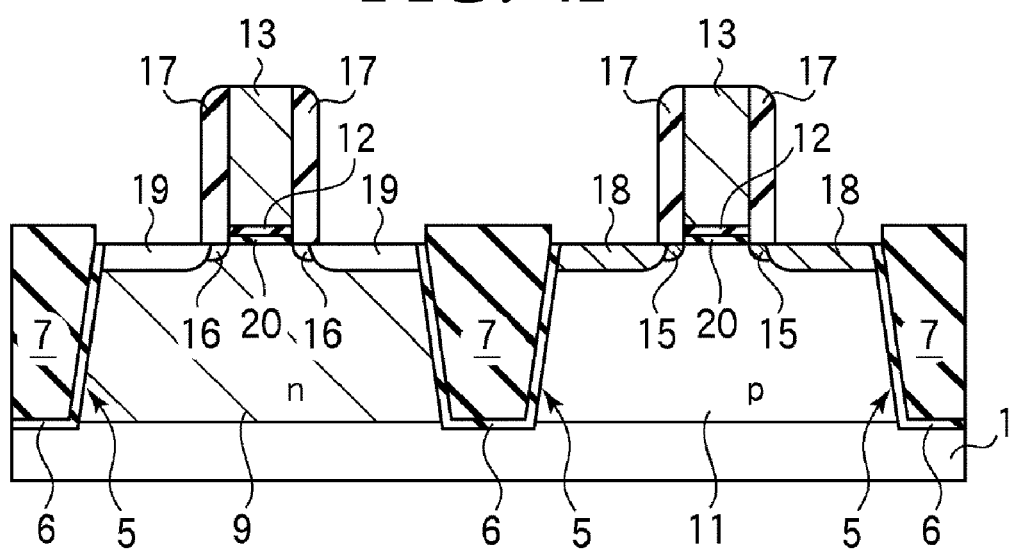
FIG. 4F is a cross-sectional view showing the example of the manufacturing method of the semiconductor device in accordance with the second embodiment.

Then, a photoresist pattern 14 corresponding to a gate electrode pattern is formed and then the polysilicon film 13 is etched with, e.g., a chlorine-based etching gas, by using the photoresist pattern 14 as a mask, thereby forming a gate electrode pattern made of the polysilicon film 13 (see FIG. 4E).

Subsequently, by implanting ions using the polysilicon film (gate electrode) 13, the silicon oxide film (STI) 7, and a photoresist (not illustrated) as masks, an n-type extension region 15 and a p-type extension region 16 are formed and then a sidewall insulating film 17 is formed at a sidewall of the polysilicon film (gate electrode) 13. Thereafter, an n-type drain region 18 and a p-type drain region 19 are formed by implanting ions using the polysilicon film (gate electrode) 13 provided with the sidewall insulating film 17 formed at its sidewall, the silicon oxide film (STI) 7, and a photoresist (not illustrated) as masks (see FIG. 4F).

As a result, a transistor is formed by the above-described manufacturing method of the semiconductor device in accordance with the second embodiment.

Second Example

Use of Degas Generating from Substrate

Oxygen, contained in the native oxide film 20 on the substrate 1' s surface, may not be used as an oxygen supply source. The thermal oxide film 20 is etched with, e.g., fluoric acid and the substrate 1 is not cleaned. Since the substrate 1 is exposed to atmosphere, moisture or oxygen is introduced in or adsorbed on the substrate 1. The moisture or oxygen introduced in or adsorbed on the substrate 1 is evaporated (degas) during the process. The degas can also be used as a gas containing oxygen for forming manganese oxide.

In accordance with the second embodiment, it is possible to provide a manufacturing method of a semiconductor device including a gate insulating film which can be formed into a thin film and of which film composition is easy to be controlled in the same manner as provided in the first embodiment.

Further, since the manganese oxide film 12 is formed by using the oxygen contained in the native oxide film 20 formed on the substrate 1 or the degas (moisture) from the substrate 1, the oxygen gas supply line 108*a* can be omitted from the manganese oxide CVD apparatus, and thus the manganese oxide CVD apparatus can be configured simply.

Third Embodiment

In the second embodiment, there has been formed the gate insulating film made of the manganese oxide film 12 by using the vapor of the organic compound containing manganese and the oxygen contained in the native oxide film 20 on the substrate 1 or the degas (moisture) from the substrate 1. In accordance with the second embodiment, the oxygen gas supply line 108*a* can be omitted from the manganese oxide CVD apparatus, and, thus, the manganese oxide CVD apparatus can be configured simply.

However, in case of the manganese oxide CVD apparatus which forms film by using the oxygen contained in the native oxide film 20 or the oxygen/moisture adsorbed on the substrate 1 through exposure to the atmosphere as an oxygen supply source, the amount of oxygen is not determinate. Therefore, the manganese oxide CVD apparatus may not be used for mass production in consideration of reproducibility or reliability.

In view of the foregoing, in a third embodiment there has been conceived a manganese oxide CVD apparatus which can be simply configured and used for mass production in view of reproducibility or reliability.

FIGS. 6A to 6F are cross-sectional views of an example of a manufacturing method of a semiconductor device in accordance with the third embodiment of the present invention.

Figure 6A:
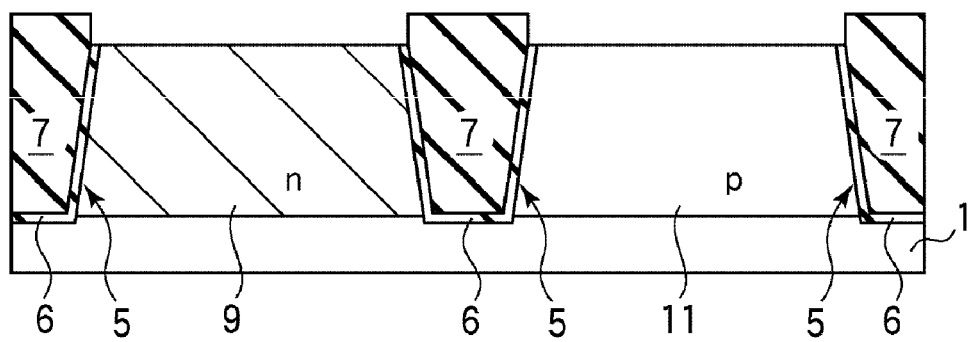
FIG. 6A is a cross-sectional view of an example of a manufacturing method of a semiconductor device in accordance with a third embodiment.

In accordance with the manufacturing method explained with reference to FIGS. 1A to 1J, a structure shown in FIG. 6A is obtained. In the structure in FIG. 6A, a thermal oxide film 2 has been etched with, e.g., fluoric acid. After the thermal oxide film 2 is etched, a substrate 1 is cleaned in the same manner as the first embodiment.

Figure 6B:
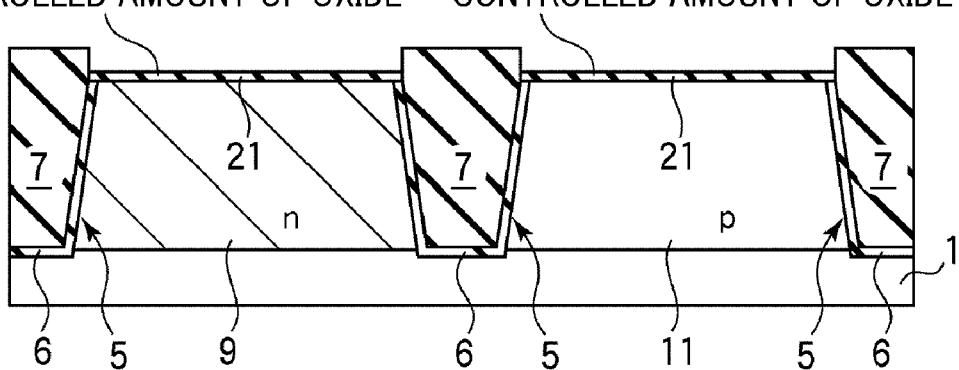
FIG. 6B is a cross-sectional view of the example of the manufacturing method of the semiconductor device in accordance with the third embodiment.
Figure 6C:
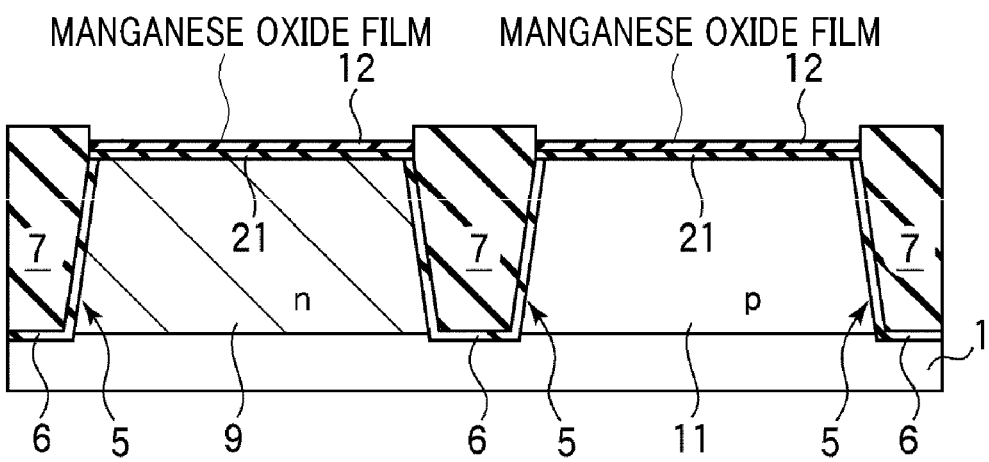
FIG. 6C is a cross-sectional view of the example of the manufacturing method of the semiconductor device in accordance with the third embodiment.

Then, a thermal oxidation apparatus forms a thermal oxide film 21 having a controlled amount of oxide on the substrate 1 by thermally oxidizing the cleaned substrate 1 (see FIG. 6B).

Subsequently, a manganese oxide CVD apparatus forms a manganese oxide film 12 on the thermal oxide film 21 having the controlled amount of oxide. When the manganese oxide film 12 is formed, vapor of an organic compound containing manganese is used but a gas containing oxygen is not used in the same manner as the second embodiment. The manganese oxide CVD apparatus 200 illustrated in FIG. 5 can be used in the third embodiment.

In the present embodiment, the thermal oxide film 21 having the controlled amount of oxide serves as an oxygen supply source. By reacting oxygen contained in the thermal oxide film 21 with the vapor of the organic compound containing manganese, the manganese oxide film 12 is formed on the thermal oxide film 21 (see FIG. 6C).

Figure 6D:
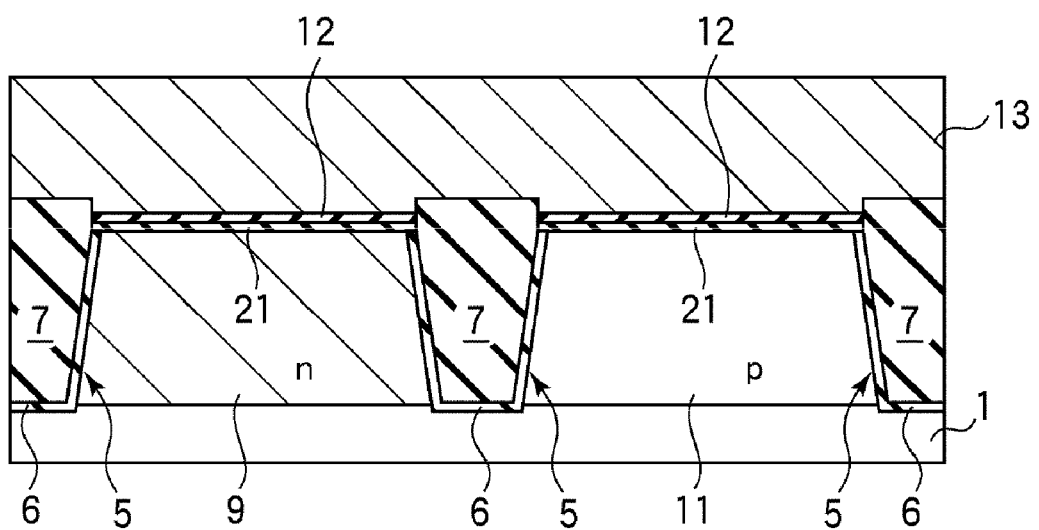
FIG. 6D is a cross-sectional view of the example of the manufacturing method of the semiconductor device in accordance with the third embodiment.

Thereafter, in the same manner as the first embodiment, the substrate 1 is cleaned and then a polysilicon 13 is formed on the manganese oxide film 12 and a silicon oxide film 7 on the substrate 1' s surface (see FIG. 6D).

Figure 6E:
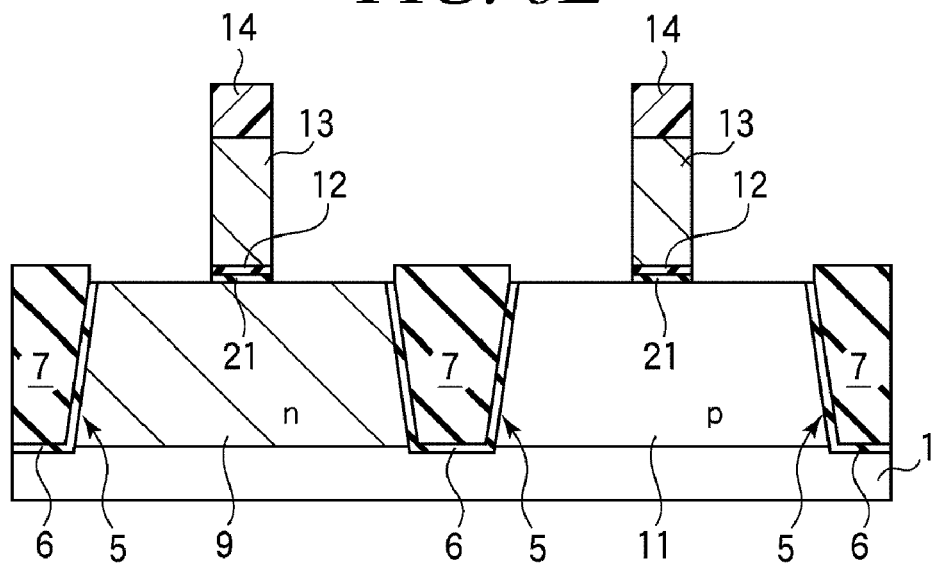
FIG. 6E is a cross-sectional view of the example of the manufacturing method of the semiconductor device in accordance with the third embodiment.
Figure 6F:
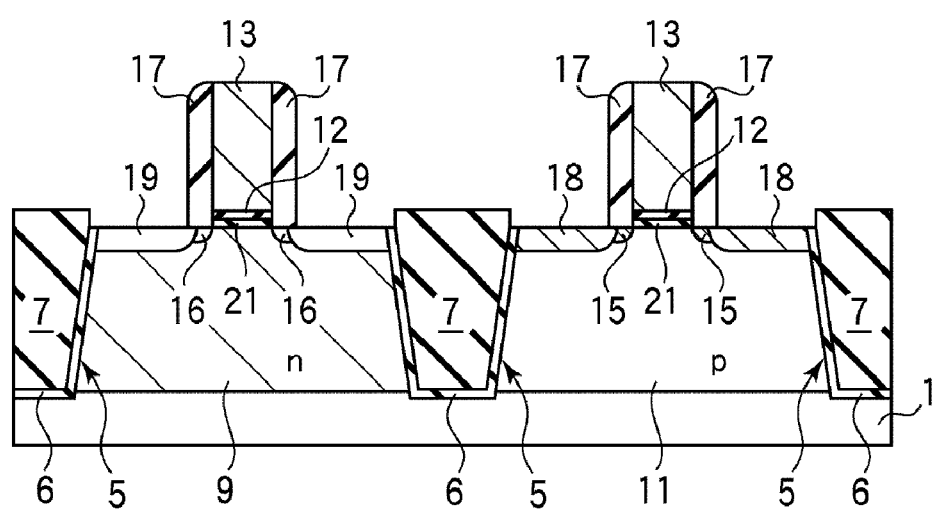
FIG. 6F is a cross-sectional view of the example of the manufacturing method of the semiconductor device in accordance with the third embodiment.

Then, a photoresist pattern 14 corresponding to a gate electrode pattern is formed, and then the polysilicon film 13 is etched with, e.g., a chlorine-based etching gas using the photoresist pattern 14 as a mask, thereby forming a gate electrode pattern made of the polysilicon film 13 (see FIG. 6E).

Subsequently, by implanting ions using the polysilicon film (gate electrode) 13, the silicon oxide film (STI) 7, and a photoresist (not illustrated) as masks, an n-type extension region 15 and a p-type extension region 16 are formed and then a sidewall insulating film 17 is formed at a sidewall of the polysilicon film (gate electrode) 13. Thereafter, an n-type drain region 18 and a p-type drain region 19 are formed by implanting ions using the polysilicon film (gate electrode) 13 provided with the sidewall insulating film 17 at its sidewall, the silicon oxide film (STI) 7, and a photoresist (not illustrated) as masks (see FIG. 6F).

Therefore, a transistor is formed by the above-described manufacturing method of the semiconductor device in accordance with the third embodiment.

In accordance with the third embodiment, the thermal oxide film 21 having the controlled amount of oxide as compared to that of the second embodiment serves as an oxygen supply source. Since the amount of oxygen contained in the thermal oxide film 21 is determinate, the manganese oxide CVD apparatus can be simply configured and used for mass production in view of reproducibility or reliability.

Fourth Embodiment

In a fourth embodiment like the third embodiment there has been conceived a manganese oxide CVD apparatus which can be simply configured and used for mass production in view of reproducibility or reliability.

FIGS. 7A to 7F are cross-sectional views of an example of a manufacturing method of a semiconductor device in accordance with the fourth embodiment of the present invention.

Figure 7A:
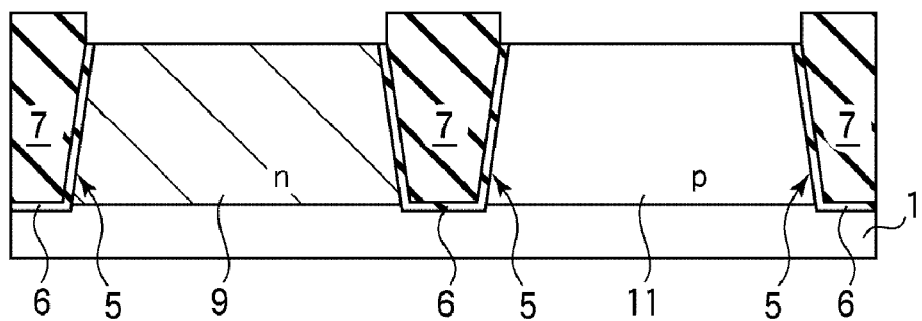
FIG. 7A is a cross-sectional view of an example of a manufacturing method of a semiconductor device in accordance with a fourth embodiment.

In accordance with the manufacturing method explained with reference to FIGS. 1A to 1J, a structure shown in FIG. 7A is fabricated. In the structure shown in FIG. 7A, a thermal oxide film 2 has been etched with, e.g., fluoric acid. After the thermal oxide film 2 is etched, a substrate 1 is cleaned in the same manner as the first embodiment.

Figure 7B:
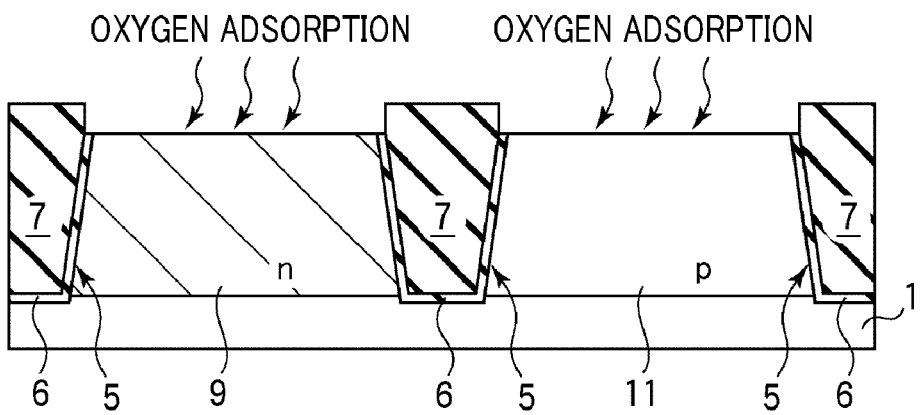
FIG. 7B is a cross-sectional view of the example of the manufacturing method of the semiconductor device in accordance with the fourth embodiment.
Figure 7C:
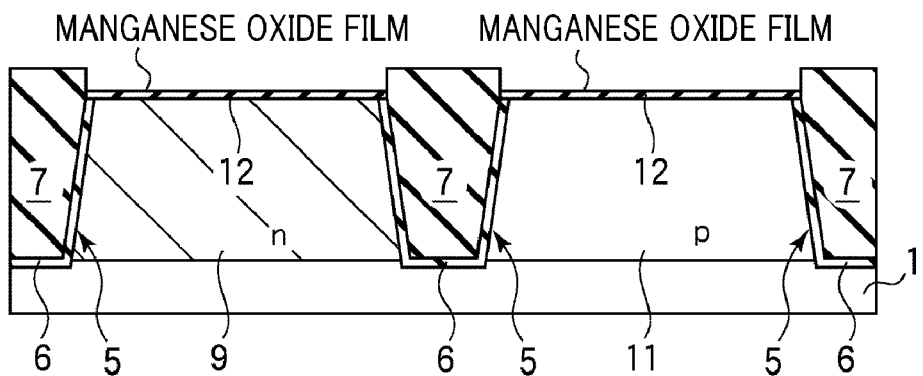
FIG. 7C is a cross-sectional view of the example of the manufacturing method of the semiconductor device in accordance with the fourth embodiment.

Then, the cleaned substrate 1 is exposed to oxygen atmosphere while controlling a supply amount of oxygen and exposure time controlled and, so that oxygen is adsorbed on the substrate 1' s surface (see FIG. 7B).

Subsequently, a manganese oxide CVD apparatus forms a manganese oxide film 12 on the substrate 1 having a controlled adsorption amount of oxygen. When the manganese oxide film 12 is formed, vapor of an organic compound containing manganese is used but a gas containing oxygen is not used in the same manner as the third embodiment. The manganese oxide CVD apparatus 200 illustrated in FIG. 5 can be used in the fourth embodiment like the third embodiment.

In the present embodiment, the substrate 1 having a controlled adsorption amount of oxygen serves as an oxygen supply source. By reacting oxygen adsorbed on the substrate with the vapor of the organic compound containing manganese, the manganese oxide film 12 is formed on the substrate 1 (see FIG. 7C).

Figure 7D:
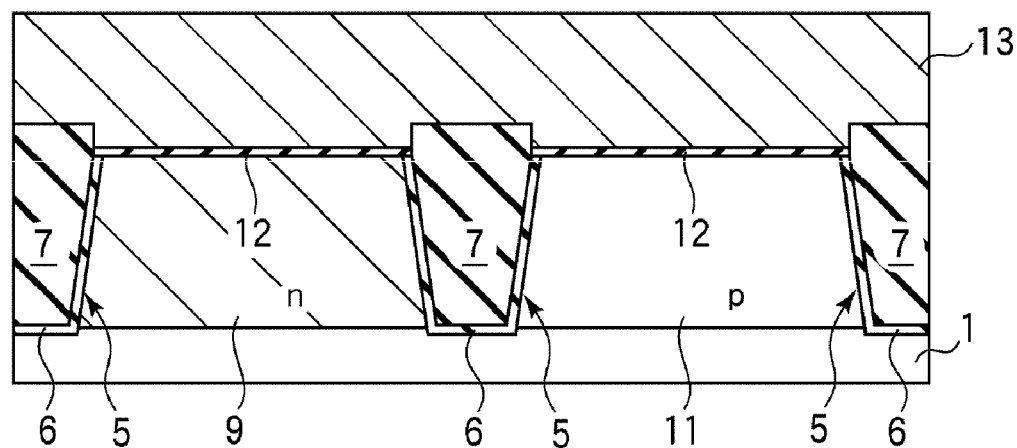
FIG. 7D is a cross-sectional view of the example of the manufacturing method of the semiconductor device in accordance with the fourth embodiment.

Thereafter, in the same manner as the first embodiment, the substrate 1 is cleaned and then a polysilicon 13 is formed on the manganese oxide film 12 and a silicon oxide film 7 on the substrate 1' s surface (see FIG. 7D).

Figure 7E:
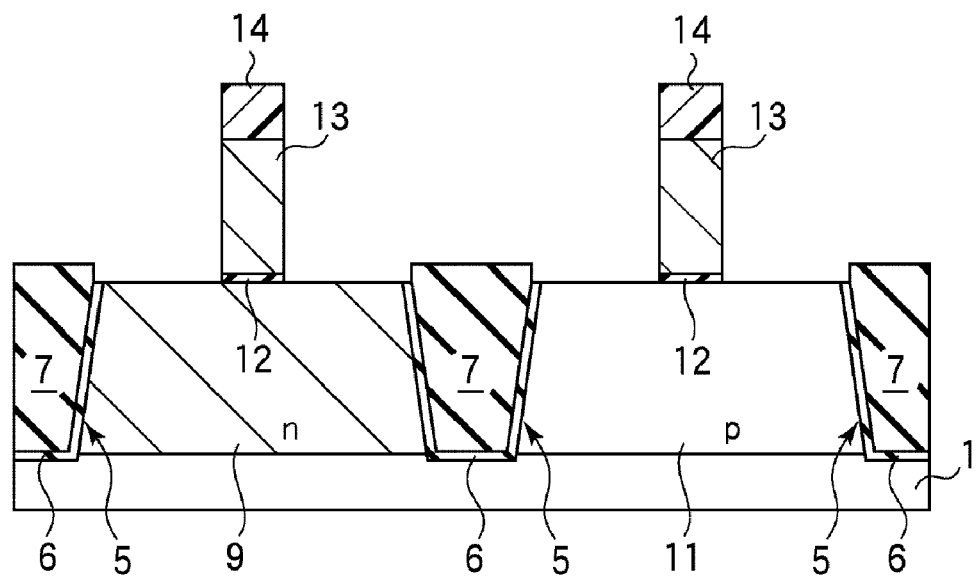
FIG. 7E is a cross-sectional view of the example of the manufacturing method of the semiconductor device in accordance with the fourth embodiment.
Figure 7F:
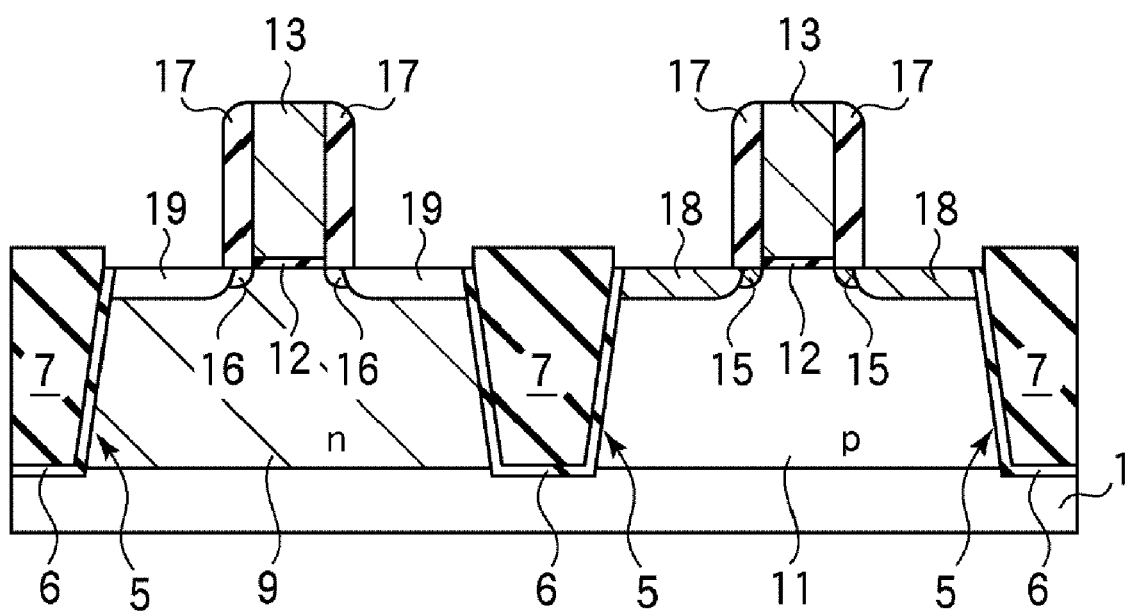
FIG. 7F is a cross-sectional view of the example of the manufacturing method of the semiconductor device in accordance with the fourth embodiment.

Then, a photoresist pattern 14 corresponding to a gate electrode pattern is formed and then the polysilicon film 13 is etched with, e.g., a chlorine-based etching gas using the photoresist pattern 14 as a mask, thereby forming a gate electrode pattern made of the polysilicon film 13 (see FIG. 7E).

Subsequently, by implanting ions using the polysilicon film (gate electrode) 13, the silicon oxide film (STI) 7, and a photoresist (not illustrated) as masks, an n-type extension region 15 and a p-type extension region 16 are formed and then a sidewall insulating film 17 is formed at a sidewall of the polysilicon film (gate electrode) 13. Thereafter, an n-type drain region 18 and a p-type drain region 19 are formed by implanting ions using the polysilicon film (gate electrode) 13 provided with the sidewall insulating film 17 at its sidewall, the silicon oxide film (STI) 7, and a photoresist (not illustrated) as masks (see FIG. 7F).

Therefore, a transistor is formed by the above-described manufacturing method of the semiconductor device in accordance with the fourth embodiment.

In accordance with the fourth embodiment, the substrate 1 having the controlled adsorption amount of oxygen as compared to that of the second embodiment serves as an oxygen supply source. Since the amount of oxygen adsorbed on the substrate 1 is determinate, the manganese oxide CVD apparatus can be simply configured and used for mass production in view of reproducibility or reliability.

The above description of the present invention is provided for the purpose of illustration, and it would be understood by those skilled in the art that various changes and modifications may be made without changing technical conception and essential features of the present invention.

For example, in the above-described embodiments, the manganese oxide film 12 is formed by a so-called "thermal CVD method" in which a wafer is heated while vapor of an organic compound containing manganese and an oxygen gas are supplied to the substrate 1. However, the manganese oxide film 12 may be formed by a plasma CVD method or a photo CVD method.

Alternatively, the manganese oxide film 12 may be formed, by stacking the thin film, by a modified method of the above-mentioned CVD methods such as an ALD (Atomic Layer Deposition) method in which a vapor of an organic compound containing manganese and an oxygen gas are intermittently supplied to the substrate 1.

Further, in the above-described embodiments, the polysilicon film 13 is used as a gate electrode. However, the gate electrode is not limited to the polysilicon film 13 and any conductive material such as metal can be used.

What is claimed is:

1. A manufacturing method of a semiconductor device, the method comprising:
   forming a native oxide film on a semiconductor substrate, on which a transistor is to be formed;
   forming a manganese oxide film for serving as a gate insulating film on the native oxide film by using the native oxide film as an oxygen supply source;
   forming a conductive film for serving as a gate electrode on the manganese oxide film; and
   forming a gate electrode and a gate insulating film by processing the conductive film and the manganese oxide film.

2. The manufacturing method of claim 1, wherein the manganese oxide film is formed on the semiconductor substrate which has not been cleaned.

3. A manufacturing method of a semiconductor device, the method comprising:
   forming a thermal oxide film having a controlled amount of oxide on a semiconductor substrate, on which a transistor is to be formed;
   forming a manganese oxide film for serving as a gate insulating film on the thermal oxide film having the controlled amount of oxide by using the thermal oxide film as an oxygen supply source;
   forming a conductive film for serving as a gate electrode on the manganese oxide film; and
   forming a gate electrode and a gate insulating film by processing the conductive film and the manganese oxide film.

4. A manufacturing method of a semiconductor device, the method comprising:
   adsorbing oxygen on a semiconductor substrate, on which a transistor is to be formed, by controlling an adsorption amount of oxygen;
   forming a manganese oxide film for serving as a gate insulating film on the semiconductor substrate having the controlled adsorption amount of oxygen;
   forming a conductive film for serving as a gate electrode on the manganese oxide film; and
   forming a gate electrode and a gate insulating film by processing the conductive film and the manganese oxide film.

5. The manufacturing method of claim 4, wherein a gas containing oxygen is not used in forming the manganese oxide film.

6. A manufacturing method of a semiconductor device, the method comprising:
- forming a thermal oxide film having a controlled amount of oxide on a semiconductor substrate, on which a transistor is to be formed;
- forming a manganese oxide film for serving as a gate insulating film on the thermal oxide film having the controlled amount of oxide;
- forming a conductive film for serving as a gate electrode on the manganese oxide film; and
- forming a gate electrode and a gate insulating film by processing the conductive film and the manganese oxide film,
- wherein a gas containing oxygen is not used in forming the manganese oxide film.

7. A manufacturing method of a semiconductor device, the method comprising:
- forming a manganese oxide film for serving as a gate insulating film on a semiconductor substrate, on which a transistor is to be formed;
- forming a conductive film for serving as a gate electrode on the manganese oxide film; and
- forming a gate electrode and a gate insulating film by processing the conductive film and the manganese oxide film,
- wherein the manganese oxide film is formed on the semiconductor substrate which has not been cleaned and a gas containing oxygen is not used in forming the manganese oxide film.

* * * * *

UNITED STATES PATENT AND TRADEMARK OFFICE
CERTIFICATE OF CORRECTION

| | | |
|---|---|---|
| PATENT NO. | : 8,119,510 B2 | Page 1 of 1 |
| APPLICATION NO. | : 12/706237 | |
| DATED | : February 21, 2012 | |
| INVENTOR(S) | : Hiroshi Sato et al. | |

It is certified that error appears in the above-identified patent and that said Letters Patent is hereby corrected as shown below:

Column 4, line 36, please add -- 7 -- between "film" and "by"

Column 4, line 58, please add -- 1 -- between "substrate" and "(see FIG. 1G)"

Column 11, line 36, please add -- 1 -- after "substrate"

Signed and Sealed this
Twenty-ninth Day of May, 2012

David J. Kappos
*Director of the United States Patent and Trademark Office*